(12) United States Patent
Xiao et al.

(10) Patent No.: US 12,404,995 B2
(45) Date of Patent: Sep. 2, 2025

(54) BACKLIGHT MODULE AND DISPLAY DEVICE

(71) Applicant: TCL CHINA STAR OPTOELECTRONICS TECHNOLOGY CO., LTD., Shenzhen (CN)

(72) Inventors: Juncheng Xiao, Shenzhen (CN); Yan Li, Shenzhen (CN); Bin Zhao, Shenzhen (CN); Ji Li, Shenzhen (CN)

(73) Assignee: TCL CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 724 days.

(21) Appl. No.: 17/290,068

(22) PCT Filed: Mar. 15, 2021

(86) PCT No.: PCT/CN2021/080715
§ 371 (c)(1),
(2) Date: Apr. 29, 2021

(87) PCT Pub. No.: WO2022/170657
PCT Pub. Date: Aug. 18, 2022

(65) Prior Publication Data
US 2023/0139020 A1    May 4, 2023

(30) Foreign Application Priority Data
Feb. 10, 2021    (CN) .......................... 202110185277.6

(51) Int. Cl.
*H01L 25/075* (2006.01)
*F21V 23/00* (2015.01)
(Continued)

(52) U.S. Cl.
CPC ......... *F21V 23/005* (2013.01); *G09G 3/3426* (2013.01); *H01L 25/0753* (2013.01);
(Continued)

(58) Field of Classification Search
CPC ................ F21V 23/005; G09G 3/3426; G09G 2300/0426; H01L 25/0753; F21Y 2115/10; H05K 2201/10106
(Continued)

(56) References Cited

U.S. PATENT DOCUMENTS 11,335,244 B2 *   5/2022   Wang ........................ G09G 3/32
2020/0257167 A1 * 8/2020   Miyata ................. G09G 3/3413

FOREIGN PATENT DOCUMENTS

| CN | 108287436 A | 7/2018 |
| CN | 108447887 A | 8/2018 |

(Continued)

*Primary Examiner* — Ori Nadav
(74) *Attorney, Agent, or Firm* — The Roy Gross Law Firm, LLC; Roy D. Gross

(57) ABSTRACT

The present application provides a backlight module and a display device. The backlight module includes: a metal layer including signal lines and first signal connection lines extending along a first direction in the same layer; and light-emitting control structures. One signal line is disposed at each of at least one side of each column of the light-emitting control structures, each light-emitting control structure is connected to the corresponding signal line, and any two adjacent ones of the light-emitting control structures in each column of the light-emitting control structures are connected through one first signal connection line.

20 Claims, 13 Drawing Sheets

(51) Int. Cl.
   *G09G 3/34*    (2006.01)
   *F21Y 115/10*  (2016.01)
(52) U.S. Cl.
   CPC .. *F21Y 2115/10* (2016.08); *G09G 2300/0426* (2013.01); *H05K 2201/10106* (2013.01)
(58) Field of Classification Search
   USPC ........................................................ 257/88
   See application file for complete search history.

(56) References Cited

FOREIGN PATENT DOCUMENTS

| | | |
|---|---|---|
| CN | 109116626 A | 1/2019 |
| CN | 111540764 A | 8/2020 |
| CN | 111752407 A | 10/2020 |
| CN | 111968566 A | 11/2020 |
| CN | 112230471 A | 1/2021 |
| WO | 2018176656 A1 | 10/2018 |
| WO | 2020001357 A1 | 1/2020 |

\* cited by examiner

BACKLIGHT MODULE AND DISPLAY DEVICE

CROSS REFERENCE TO RELATED APPLICATIONS

This application is a National Phase of PCT Patent Application No. PCT/CN2021/080715 having International filing date of Mar. 15, 2021, which claims the benefit of priority of Chinese Application No. 202110185277.6 filed Feb. 10, 2021. The contents of the above applications are all incorporated by reference as if fully set forth herein in their entirety.

FIELD OF DISCLOSURE

The present application relates to a field of display technology and in particular, to a backlight module and a display device.

DESCRIPTION OF RELATED ART

Micro-LED is one of the most promising technologies among the display technologies for the next generation. Compared with current LCD and OLED display devices, micro-LED has the advantages of fast response time, wide color gamut, high resolution (i.e., PPI, measured in pixel per inch), and low power consumption. However, micro-LED involves many difficult and complicated techniques. Especially, bottlenecks occur when to realize mass transfer of the micro-LED key technology and to miniaturize LED particles. By contrast, as a combination of micro-LED and a backplane, mini-LED has a high contrast ratio, high color rendering performance, and other characteristics comparable to OLED, and a manufacturing cost of mini-LED is slightly higher than LCD and is only about 60% of the cost of the OLED, which makes mini-LED easier to implement than micro-LED and OLED. Therefore, there has been a trend for major panel manufacturers to develop mini-LED.

However, lines connected to a driving circuit board (FPC) in a conventional mini-LED product are arranged as a network structure. To avoid short circuits between different lines, it is necessary to have multiple metal layers so that different lines can be designed in different metal layers, which results in a complex wiring design, and the design of multiple metal layers affects product yield and increases costs.

SUMMARY

The embodiments of the present application provide a backlight module and a display device, which can simplify the wiring design, improve the product yield, and reduce the costs.

A backlight module is provided according to one embodiment of the present application, comprising:

a substrate;

a metal layer disposed on the substrate, the metal layer comprising a plurality of signal lines and a plurality of first signal connection lines extending along a first direction, wherein the signal lines and the first signal connection lines are arranged in a same layer; and a plurality of light-emitting control structures disposed on the metal layer and arranged in a plurality of columns, wherein one of the signal lines is disposed at each of at least one side of each column of the light-emitting control structures, each of the light-emitting control structures in each column of the light-emitting control structures is connected to a corresponding one of the signal lines, and any two adjacent ones of the light-emitting control structures in each column of the light-emitting control structures are connected through one of the first signal connection lines.

In one preferable embodiment, one of the signal lines is arranged at one side of each column of the light-emitting control structures; or two of the signal lines are disposed at two sides of each column of the light-emitting control structure; or one of the signal lines is arranged between each two columns of the light-emitting control structures; or one of the signal lines is arranged between any two adjacent columns of the light-emitting control structures.

In one preferable embodiment, each of the light-emitting control structures comprises a controller and at least one light-emitting unit; and each of the controllers in each column of the light-emitting control structures and the corresponding signal line are electrically connected to the corresponding at least one light-emitting unit, and any two adjacent ones of the controllers in each column of the light-emitting control structures are electrically connected through one of the first signal connection lines.

In one preferable embodiment, the metal layer further comprises a plurality of second signal connection lines extending along the first direction, and the second signal connection lines are arranged in the same layer as the signal lines and the first signal connection lines; and each of the controllers and the corresponding at least one light-emitting unit are electrically connected to a corresponding one of the second signal connection lines.

In one preferable embodiment, the controller and the corresponding at least one light-emitting unit are arranged along a second direction, the second signal connection line is arranged between the controller and the at least one light-emitting unit, and the at least one light-emitting unit is arranged between the controller and the corresponding signal line; or the controller and the corresponding at least one light-emitting unit are arranged along the first direction, and the second signal connection line is arranged at one side of the at least one light-emitting unit away from the corresponding signal line.

In one preferable embodiment, each of the light-emitting units comprises a plurality of LED lamps arranged in at least one row along the second direction; and the LED lamps of each row in the light-emitting unit are connected in series, one end of each row of the LED lamps connected in series is electrically connected to the corresponding second signal connection line, and another end of each row of the LED lamps is electrically connected to the corresponding signal line.

In one preferable embodiment, the metal layer further comprises a plurality of transmission lines extending along the first direction, the controllers in each column of the light-emitting control structures constitute a column of the controllers, and each of the controllers in each column of the controllers is connected to a corresponding one of the transmission lines; and one of the transmission lines is disposed at one side of each column of the controllers and arranged away from the corresponding signal line, and/or at least one of the transmission lines is arranged between each column of the controllers and the substrate.

In one preferable embodiment, the transmission lines comprise at least one type of transmission lines, and each column of the controllers is correspondingly connected to the same type of transmission lines.

In one preferable embodiment, the backlight module further comprises a first conductive structure, and the signal lines are electrically connected through the first conductive structure.

In one preferable embodiment, the metal layer further comprises a first wiring connection line extending in a second direction, and the first conductive structure is the first wiring connection line; and the first wiring connection line is arranged at one end of each of the signal lines and is connected to the signal lines.

In one preferable embodiment, the first conductive structure is a second wiring connection line disposed on a back side of the substrate; the signal lines extend along a side surface of the substrate to the back side of the substrate and are connected to the second wiring connection line; or the signal lines penetrate through the substrate and are connected to the second wiring connection line.

In one preferable embodiment, the backlight module further comprises a first driving structure, and the first driving structure is connected with one end of each of the signal lines and one end of each column of the light-emitting control structures; and when the first conductive structure and the first driving structure are disposed on a same side of the substrate and arranged at a same end of the signal lines, the first conductive structure is disposed between the first driving structure and the substrate, or the first conductive structure is disposed at one side of the first driving structure away from the signal lines.

In one preferable embodiment, the backlight module further comprises a first driving structure, the first driving structure is connected with one end of each of the signal lines and one end of each column of the light-emitting control structures, and the first conductive structure is a third wiring connection line disposed on the first driving structure; and the signal lines extend to the first driving structure and are connected to the third wiring connection line.

In one preferable embodiment, the first driving structure comprises a first driving circuit board and a second driving circuit board, and the third wiring connection line comprises a first connection sub-line disposed on the first driving circuit board and a second connection sub-line disposed on the second driving circuit board; and the signal lines comprise a plurality of first signal lines and a plurality of second signal lines, the first signal lines extend to the first driving circuit board and are connected to the first connection sub-line, and the second signal lines extend to the second driving circuit board and are connected to the second connection sub-line.

In one preferable embodiment, the backlight module further comprises a second driving structure, the second driving structure is disposed at one end of each of the signal lines, and the first conductive structure is a fourth wiring connection line disposed on the second driving structure; and the signal lines extend to the second driving structure and are connected to the fourth wiring connection line.

In one preferable embodiment, the second driving structure comprises a third driving circuit board and a fourth driving circuit board, and the fourth wiring connection line comprises a third connection sub-line disposed on the third driving circuit board and a fourth connection sub-line disposed on the fourth driving circuit board; and the signal lines comprise a plurality of third signal lines and a plurality of fourth signal lines, the third signal lines extend to the third driving circuit board and are connected to the third connection sub-line, and the fourth signal lines extend to the fourth driving circuit board and are connected to the fourth connection sub-line.

In one preferable embodiment, the first conductive structure is a first conductive layer disposed on a side surface of the substrate; and the signal lines extend to the side surface of the substrate and are connected to the first conductive layer.

In one preferable embodiment, the first conductive structure is a third conductive layer disposed on a back side of the substrate; and the third conductive layer passes through the substrate to be connected to the signal lines.

In one preferable embodiment, the second conductive layer comprises a plurality of conductive lines; and each of the conductive lines penetrates through the dielectric layer to be connected to the signal lines.

In one preferable embodiment, the dielectric layer is an insulating layer, and the second conductive layer completely covers the insulating layer.

In one preferable embodiment, the first conductive structure is a third conductive layer disposed on a back side of the substrate; and the third conductive layer passes through the substrate to be connected to the signal lines.

In one preferable embodiment, the backlight module further comprises a second conductive structure, and the transmission lines of the same type are electrically connected through the second conductive structure.

The present application further provides a display device, comprising a display panel and the backlight module mentioned above, wherein the display panel is disposed on the backlight module.

A metal layer is disposed on a substrate. The metal layer comprises a plurality of signal lines and a plurality of first signal connection lines extending along a first direction. The signal lines and the first signal connection lines are arranged in the same layer. One signal line is disposed at each of at least one side of each column of light-emitting control structures. Each light-emitting control structure in each column of the light-emitting control structures is connected to the corresponding signal line, and any two adjacent light-emitting control structures in each column of the light-emitting control structures are connected by one first signal connection line to simplify a wiring design and ensure that the lines are located in the same metal layer, thus improving the product yield and reducing the cost.

BRIEF DESCRIPTION OF DRAWINGS

The present application is described in detail below in conjunction with the accompanying drawings for ease of understanding the technical solutions and other beneficial effects of the present application.

DETAILED DESCRIPTION OF EMBODIMENTS

Figure 1:
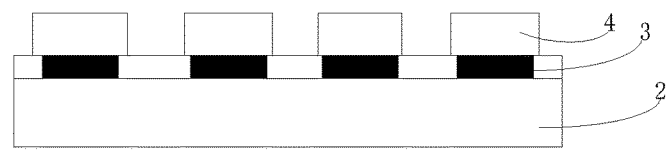
FIG. 1 is a schematic cross-sectional view of a backlight module according to one embodiment of the present application.

The specific structure and functional details disclosed herein are only representative examples, and are used for the purpose of describing exemplary embodiments of the present application. However, the present application can be embodied in many alternative forms, and should not be construed as being limited only to the embodiments set forth herein.

In the description of the present application, it should be understood that directional terms, such as "center", "lateral", "upper", "lower", "left", "right", "vertical", "horizontal", "top", "bottom", "inner", and "outer", are for the convenience of describing the application and simplifying the description based on the orientation or positional relationship shown in the drawings. The directional terms do not indicate or imply that the device or the element must have a specific orientation, be constructed and operated in a specific orientation, and therefore cannot be construed as a limitation of the present application. In addition, the terms "first" and "second" are for illustrative purposes only, and cannot be interpreted to indicate or imply relative importance or implicitly indicate the number of indicated technical features. Thus, the features defined with "first" and "second" may explicitly or implicitly include one or more of these features. In the description of the present application, unless otherwise specified, "multiple" means two or more. In addition, the term "comprising" and any variations thereof is intended to cover non-exclusive inclusion.

In the description of the present application, it should be noted that, unless otherwise clearly specified and limited, the terms "installed", "connected", and "coupled" should be understood in a broad sense. For example, elements can be a fixedly connected, or detachably connected, or integrally connected; elements can be mechanically connected or electrically connected; elements can be directly connected or indirectly connected through an intermediate medium, and internal spaces of two elements can communicate with each other. For those of ordinary skill in the art, the specific meanings of the above-mentioned terms in this present application can be understood on a case-by-case basis.

The terms used herein are only for describing specific embodiments and are not intended to limit the example embodiments. Unless the context clearly indicates otherwise, the singular forms "a" and "one" used herein are also intended to include the plural forms. It should also be understood that the terms "including" and/or "comprising" used herein specify the presence of the stated features, integers, steps, operations, units and/or components, and do not exclude the presence or addition of one or more other features, integers, steps, operations, units, components, and/or combinations thereof.

The present application is further described below in conjunction with the accompanying drawings and embodiments.

As shown in FIG. 1, one embodiment of the present application provides a backlight module, which includes a substrate 2, a metal layer 3 and a plurality of light-emitting control structures 4. The metal layer 3 is disposed on the substrate 2, the light-emitting control structures 4 are disposed on the metal layer 3, and the light-emitting control structures 4 are arranged in a plurality of columns, as shown in FIGS. 2 to 8. Each column of the light-emitting control structures 4 is arranged along a first direction, and the first direction can be a vertical direction, a horizontal direction, or an oblique direction. Each column of the light-emitting control structures 4 can include one light-emitting control structure 4, or multiple (two or more) light-emitting control structures 4, the number of light-emitting control structures 4 in different columns can be the same or different, and the light-emitting control structures 4 in different columns can be arranged side by side or staggered; and the present application is not limited in this regard.

Figure 2:
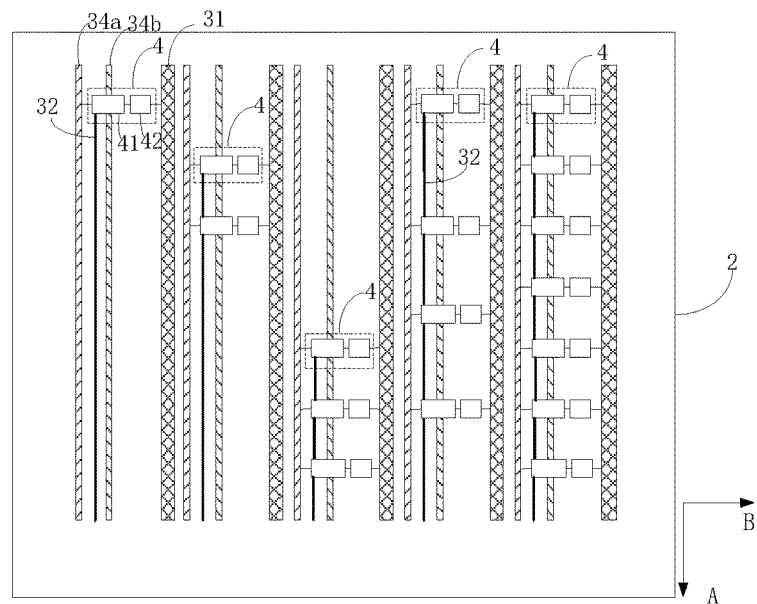
FIG. 2 is a schematic structural view of the backlight module according to one embodiment of the present application.

For example, the first direction A is a vertical direction. As shown in FIG. 2, the light-emitting control structures 4 are arranged in columns, and the light-emitting control structures 4 in different columns are different in number. As shown in FIGS. 3 to 8, the light-emitting control structures 4 are arranged in multiple rows and multiple columns, and the light-emitting control structures 4 in different columns are the same in number.

The metal layer 3 comprises a plurality of signal lines 31, and one of the signal lines 31 is disposed on each of at least one side of each column of the light-emitting control structures 4.

Figure 3:
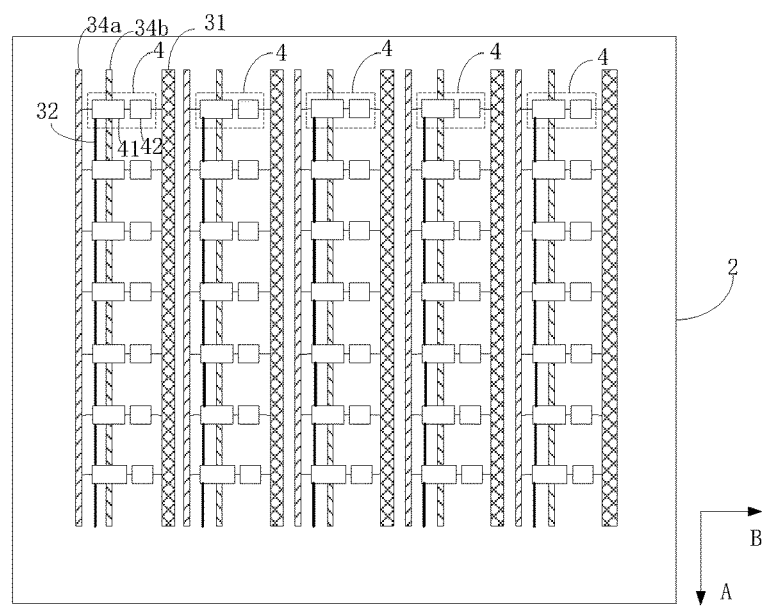
FIG. 3 is a schematic structural view of the backlight module according to one embodiment of the present application.
Figure 4:
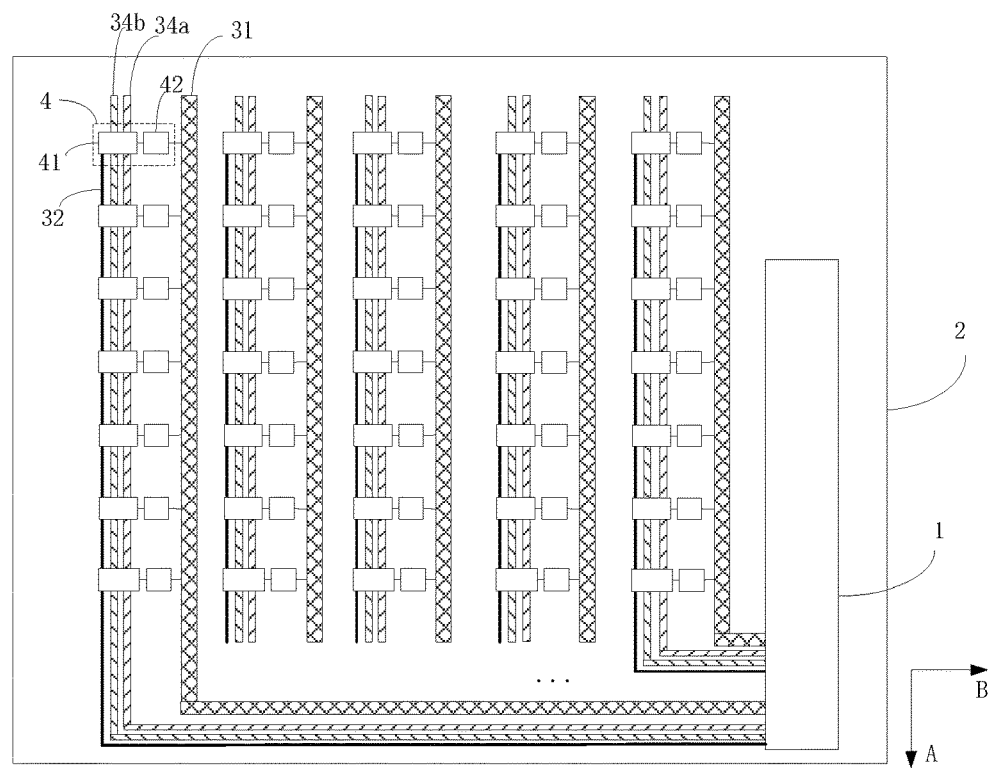
FIG. 4 is a schematic structural view of the backlight module according to one embodiment of the present application.
Figure 5:
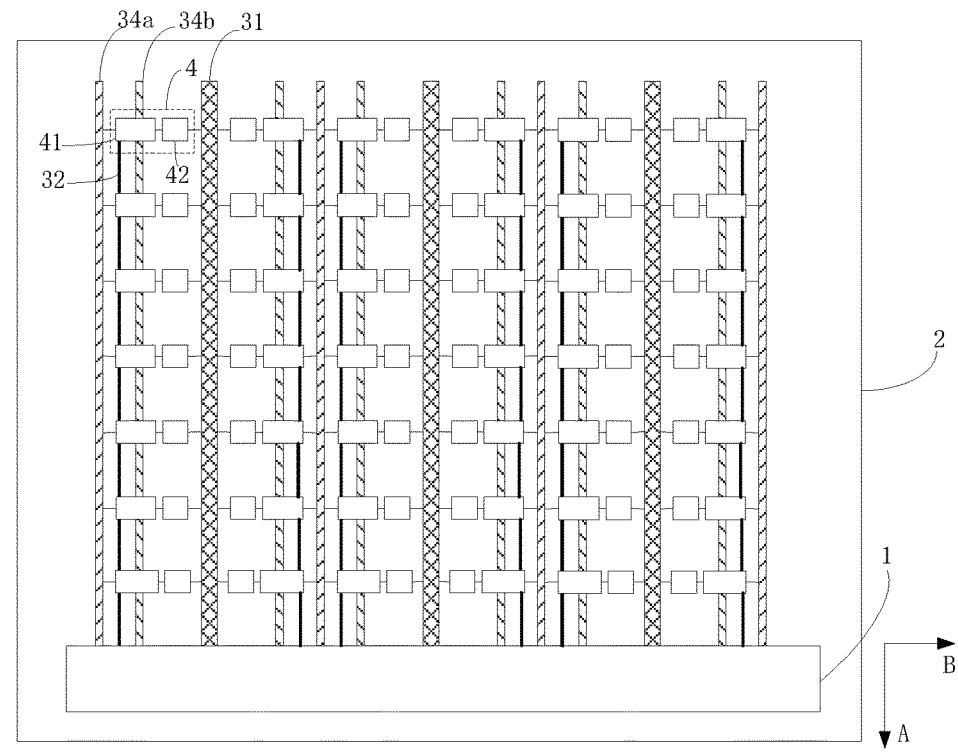
FIG. 5 is a schematic structural view of the backlight module according to one embodiment of the present application.
Figure 6:
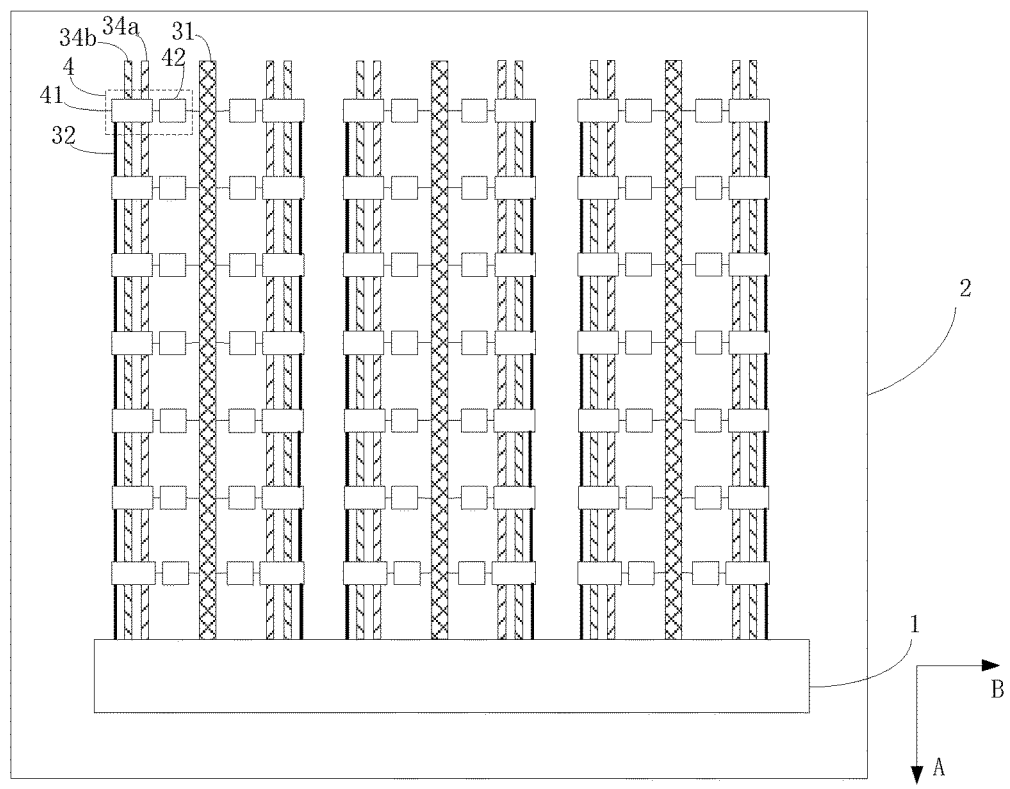
FIG. 6 is a schematic structural view of the backlight module according to one embodiment of the present application.
Figure 7:
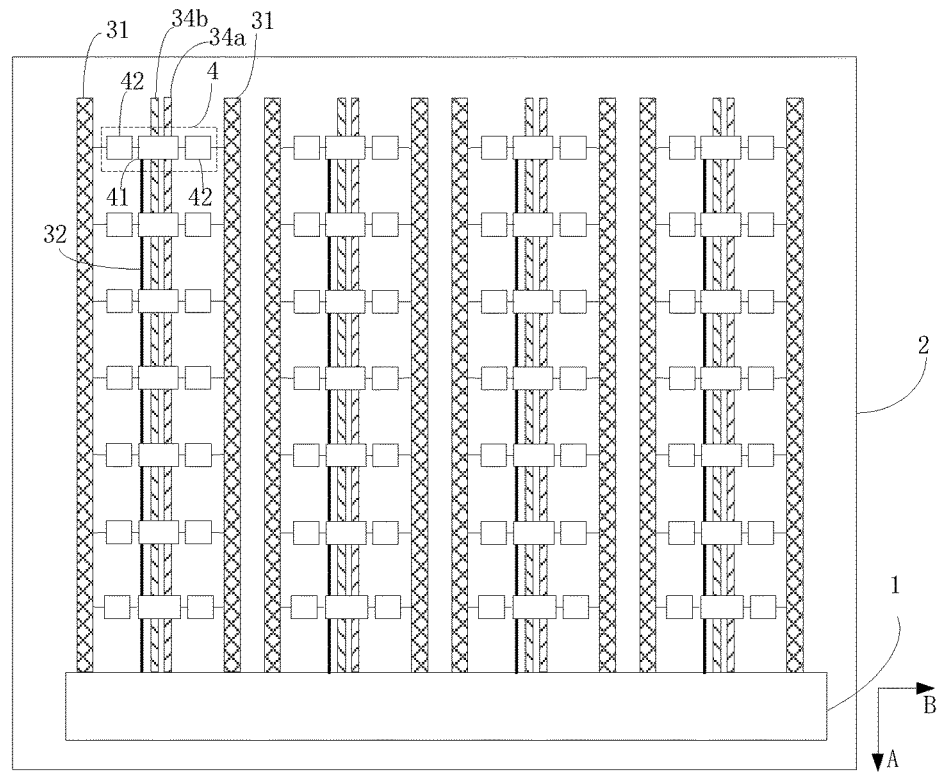
FIG. 7 is a schematic structural view of the backlight module according to one embodiment of the present application.
Figure 8:
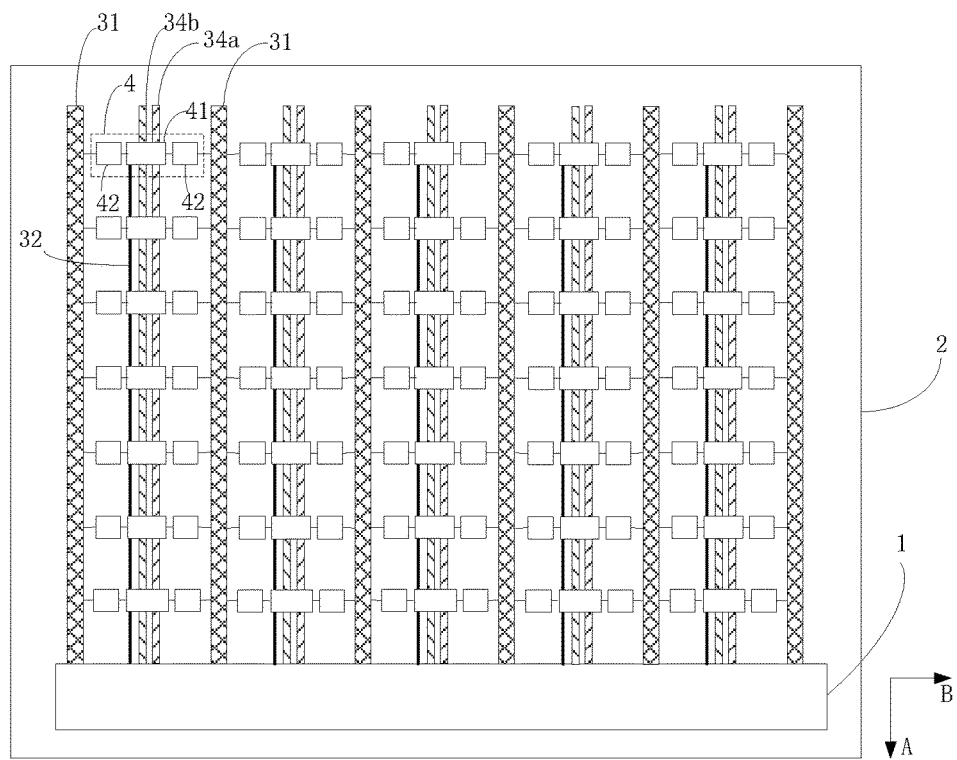
FIG. 8 is a schematic structural view of the backlight module according to one embodiment of the present application.

For example, as shown in FIGS. 2 to 4, one of the signal lines 31 is arranged at each side of each column of the light-emitting control structures 4. Alternatively, as shown in FIG. 7, two signal lines 31 are respectively disposed at two sides of each column of the light-emitting control structures 4. Alternatively, as shown in FIG. 5 and FIG. 6, when there are multiple columns of the light-emitting control structures 4, one of the signal lines 31 is disposed between each two columns of the light-emitting control structures 4, so that one pair of the light-emitting control structures 4 is a group, and each group shares the same signal line 31. Alternatively, as shown in FIG. 8, one of the signal lines 31 is disposed between any two adjacent columns of the light-emitting control structures 4, so that any two adjacent columns of the light-emitting control structures 4 share one signal line 31. The signal lines 31 extend along the first direction A, and an extending length of the signal line 31 can be greater than or equal to a length of a column of the light-emitting control structures 4, so that each light-emitting control structure 4 in each column of the light-emitting control structures 4 can be connected to the corresponding signal line 31 by a shortest distance or no distance.

As shown in FIGS. 4 to 9, the backlight module also includes a first driving structure 1. The first driving structure 1 can be disposed on a front side (i.e., one side of the substrate 2 close to the metal layer 3) of the substrate 2, and the first driving structure 1 can also be disposed on a back side (i.e., one side of the substrate 2 away from the metal layer 3) of the substrate 2.

One end of each signal line 31 is connected to the first driving structure 1, so that the first driving structure 1 is electrically connected to one end of each light-emitting control structure 4 through the signal line 31, and thereby the first driving structure 1 transmits signals to each light-emitting control structure 4.

Figure 9:
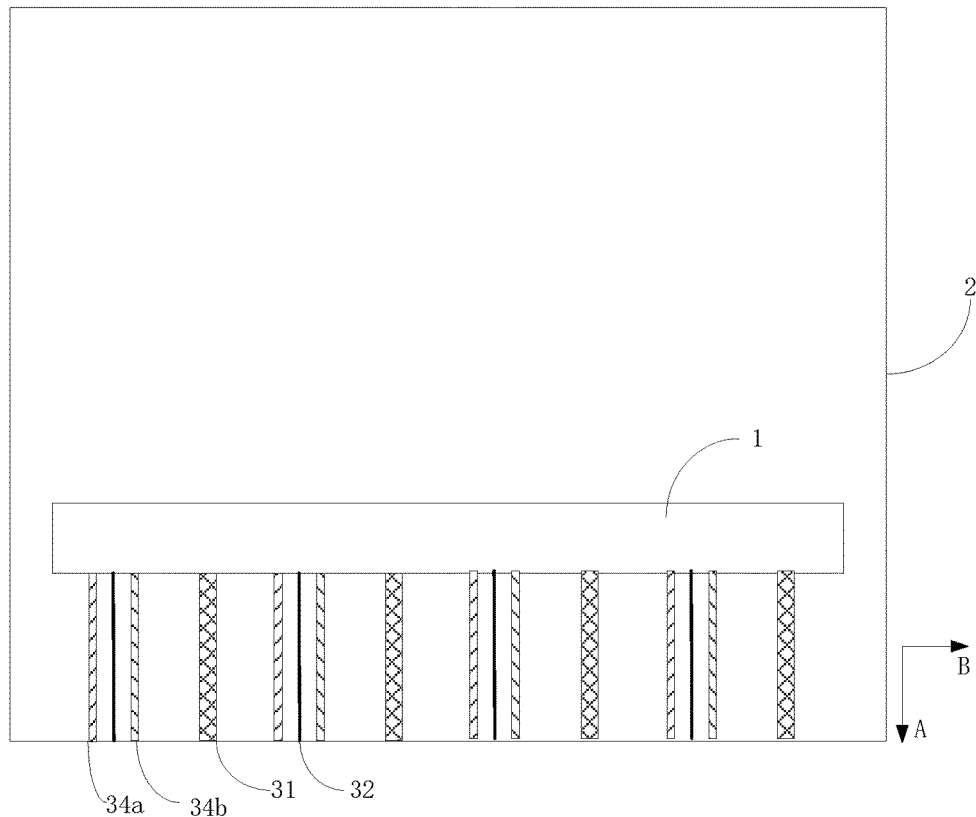
FIG. 9 is a schematic structural view of the backlight module according to one embodiment of the present application.

When the first driving structure 1 is disposed on the front side of the substrate 2, as shown in FIGS. 5 to 8, the first driving structure 1 can be arranged in the extending direction of the signal line 31, and each signal line 31 can extend along the first direction A to the first driving structure 1 and is connected to the first driving structure 1. Alternatively, as shown in FIG. 4, the first driving structure 1 is not arranged in the extending direction of the signal lines 31, and each signal line 31 first extends along the first direction A, and then extends along a second direction B to the first driving structure 1 to be connected to the first driving structure 1. The second direction B can be perpendicular to the first direction A. In other embodiments, the second direction B can also be inclined relative to the first direction A. When the first driving structure 1 is disposed on the back side of the substrate 2, as shown in FIG. 9, the signal line 31 can extend to the back side of the substrate 2 through a side surface of the substrate 2 to be connected to the first driving structure 1, or the signal line 31 can penetrate through the substrate 2 to be connected to the first driving structure 1.

The metal layer 3 further comprises a plurality of first signal connection lines 32, and the first signal connection lines 32 and the signal lines 31 are arranged in the same layer. When a column of the light-emitting control structures 4 comprises multiple light-emitting control structures 4, any two adjacent light-emitting control structures 4 in the column of the light-emitting control structures 4 are connected by one first signal connection line 32, and the light-emitting control structure 4 closest to the first driving structure 1 in this column of the light-emitting control structures 4 can be connected to the first driving structure 1 through one of the first signal connection lines 32. When one column of the light-emitting control structures 4 comprises only one of the light-emitting control structures 4, the light-emitting control structure 4 in this column of the light-emitting control structures 4 can be directly connected to the first driving structure 1 through one first signal connection line 32, as shown in FIG. 2. The first signal connection lines 32 are parallel to and spaced from the signal lines 31, that is, the first signal connection lines 32 extend along the first direction A. The first driving structure 1 can transmit signals to each light-emitting control structure 4 through the first signal connection line 32.

To be specific, when the first driving structure 1 is disposed on the front side of the substrate 2, the first signal connection lines 32 connected to the first driving structure 1 can extend to the first driving structure 1 along the first direction A, or the first signal connection lines 32 connected to the first driving structure 1 can first extend along the first direction A and then extend along the second direction B to the first driving structure 1. When the first driving structure 1 is disposed on the back side of the substrate 2, as shown in FIG. 9, the first signal connection lines 32 connected to the first driving structure 1 can extend through the side surface of the substrate 2 to the first driving structure on the back side of the substrate 2, or the first signal connection lines 32 connected to the first driving structure 1 directly penetrate through the substrate 2.

Furthermore, as shown in FIGS. 2 to 8, each light-emitting control structure 4 comprises a controller 41 and at least one light-emitting unit 42. Each controller 41 in each column of the light-emitting control structures 4 and the corresponding signal line 31 are electrically connected to the at least one light-emitting unit 42. When one column of the light-emitting control structures 4 comprises multiple light-emitting control structures 4, any adjacent two controllers 41 in this column of the light-emitting control structures 4 are connected by one of the first signal connection lines 32, and the controller 41 closest to the first driving structure 1 in this column of the light-emitting control structures 4 is connected to the first driving structure 1 through one of the first signal connection lines 32. When one column of the light-emitting control structures 4 comprises only one light-emitting control structure 4, the controller 41 in this column of the light-emitting control structures 4 can be directly connected to the first driving structure 1 through one of the first signal connection lines 32, so that the first driving structure 1 can transmit signals to the controller 41, and then drive the corresponding light-emitting unit 42 through the controller 41.

Furthermore, as shown in FIGS. 10 to 13, the metal layer 3 further comprises a plurality of second signal connection lines 33 extending along the first direction A. The second signal connection lines 33 and the first signal connection lines 32 are arranged in the same layer as the signal lines 31. Each controller 41 and its corresponding light-emitting unit 42 are electrically connected to one of the second signal connection lines 33.

Each light-emitting unit 42 comprises a plurality of LED lamps 43 arranged in at least one row along the second direction B, and the second direction B and the first direction A can intersect or be perpendicular to each other. When the number of the LED lamps in one row is multiple, the LED lamps 43 in this row are connected in series and connected between the corresponding second signal connection line 33 and the corresponding signal line 31. When the number of the LED lamps 43 in one row is one, the LED lamp in this row is directly connected between the corresponding second signal connection line 33 and the corresponding signal line 31.

As shown in FIGS. 10 to 13, one light-emitting unit 42 can comprise sixteen LED lamps 43 distributed in four rows and four columns. The LED lamps 43 of each row in the light-emitting unit 42 are connected in series, and the LED lamps 43 of different rows are connected in parallel. That is to say, one end of each row of serially connected LED lamps 43 is electrically connected to the second signal connection line 33, and another end of each row of serially connected LED lamps 43 is electrically connected to the corresponding signal line 31. Wherein, an extending length of the second signal connection line 33 can be equal to a length of one column of the LED lamps 43 in the light-emitting unit 42 to ensure that each row of the LED lamps 43 in the light-emitting unit 42 can be electrically connected to the corresponding second signal connection line 33 by a shortest distance or no distance, thus reducing a space occupied by the second signal connection line 33. In the present embodiment, different rows of the LED lamps 43 in the light-emitting unit 42 are connected in parallel to ensure that if a certain LED lamp is damaged, it only causes the LED lamps of the row where the damaged LED lamp is located to go off, without affecting all the LED lamps of the light-emitting unit. By adjusting the brightness of other rows of the LED lamps in the light-emitting unit (the brightness can be adjusted by, for example, increasing a driving current), it can be ensured that the overall brightness of the light-emitting unit 42 is not affected, and the overall product yield is improved.

The controller 41, the corresponding light-emitting unit 42, and the corresponding second signal connection line 33 can have various positional relationships. If one signal line 31 is disposed at any side of one column of the light-emitting control structures 4, or one signal line 31 is arranged between every two columns of the light-emitting control structures 4, the controller and the corresponding at least one light-emitting unit 42 can be arranged along the first direction A or along the second direction B.

Figure 10:
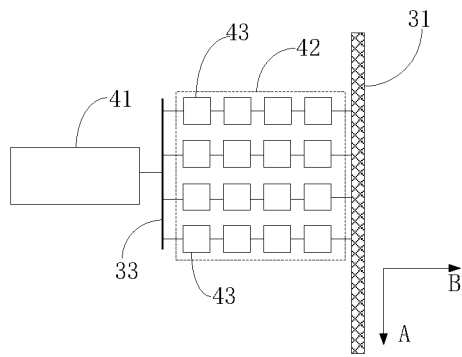
FIG. 10 is a schematic view illustrating a light-emitting control structure in the backlight module according to one embodiment of the present application.

For example, as shown in FIG. 10, the controller 41 and the corresponding light-emitting unit 42 can be distributed along the second direction B (if the controller 41 is arranged corresponding to multiple light-emitting units 42, the multiple light-emitting units 42 can be distributed along the first direction A). The second signal connection line 33 is disposed between the corresponding controller 41 and the corresponding light-emitting unit 42, and the light-emitting unit 42 is disposed between the corresponding controller 41 and the corresponding signal line 31. Alternatively, the second signal connection line 33 is disposed at one side of the corresponding light-emitting unit 42 away from the corresponding signal line 31, and the controller 41 is disposed between the corresponding light-emitting unit 42 and the corresponding signal line 31.

Figure 11:
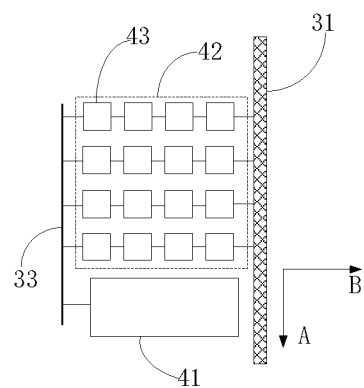
FIG. 11 is a schematic view illustrating the light-emitting control structure in the backlight module according to one embodiment of the present application.

In another example, as shown in FIG. 11, the controller 41 and the corresponding at least one light-emitting unit 42 can be distributed along the first direction A, and the second signal connection line 33 is disposed at one side of the corresponding light-emitting unit 42 and arranged away from the signal line 31.

Figure 12:
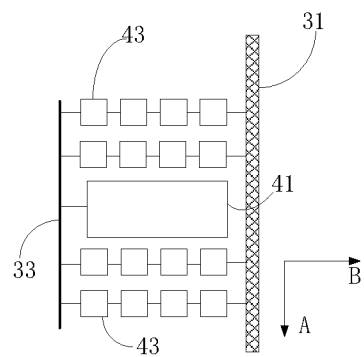
FIG. 12 is a schematic view illustrating the light-emitting control structure in the backlight module according to one embodiment of the present application.

When the light-emitting unit 42 comprises multiple rows of the LED lamps 43, the controller 41 can also be located between the multiple rows of the LED lamps 43 of the light-emitting unit 42, as shown in FIG. 12.

Figure 13:
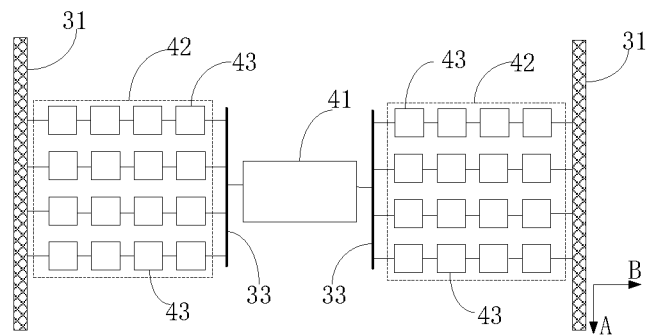
FIG. 13 is a schematic view illustrating the light-emitting control structure in the backlight module according to one embodiment of the present application.

If two signal lines 31 are disposed at two sides of one column of the light-emitting control structures 4, one second signal connection line 33 is correspondingly disposed between the controller 41 and each signal line 31, and at least one light-emitting unit 42 arranged along the first direction A is disposed between each second signal connection line 33 and the corresponding signal line 31, as shown in FIG. 13.

As shown in FIGS. 2 to 8, the metal layer 3 can also comprise a plurality of transmission lines 34 extending along the first direction A. That is to say, the transmission lines 34, the signal lines 31, and the first signal connection lines 32, the second signal connection lines 33 are all arranged in the same layer and are parallel and spaced apart from each other. The controllers 41 in each column of the light-emitting control structures 4 constitute a column of the controllers 41, and one transmission line 34 is arranged at one side of each column of the controllers 41 and disposed away from the corresponding signal line 31, and/or at least one transmission line 34 can be correspondingly disposed between each column of the controllers 41 and the substrate 2, that is, at least one transmission line 34 can be disposed directly under each column of the controllers 41. Each controller 41 in each column of the controllers 41 is connected to the corresponding transmission line 34, and one end of each transmission line 34 is connected to the first driving structure 1, so that the first driving structure 1 transmits signals to the controller 41 through the transmission line 34.

Specifically, when the first driving structure 1 is located on the front side of the substrate, the transmission line 34 can extend to the first driving structure 1 along the first direction A and be connected to the first driving structure 1. Alternatively, the transmission line 34 can first extend along the first direction A, and then extend along the second direction B to the first driving structure 1 to be connected to the first driving structure 1. When the first driving structure 1 is located on the back side of the substrate 2, the transmission line 34 can extend to the back side of the substrate 2 through the side surface of the substrate 2 to be connected to the first driving structure 1. Alternatively, the transmission line 34 penetrates through the substrate 2 to be connected to the first driving structure 1.

The transmission lines 34 can comprise at least one type of transmission line, and different types of transmission lines transmit different signals. Each column of the controllers 41 is disposed corresponding to one transmission line of the same type, that is, each column of the controllers 41 is connected to only one transmission line of the same type, but each column of the controllers 41 can be connected to different types of transmission lines. Therefore, when there are multiple transmission lines 34 disposed between each column of the controllers 41 and the substrate 2, the transmission lines 34 are different types of transmission lines, and the transmission lines 34 are arranged at intervals.

The transmission lines 34 can comprise a plurality of first-type transmission lines, that is, a plurality of transmission lines 34*a*. Each column of the controllers 41 can be arranged corresponding to one transmission line 34*a*, and each controller 41 in each column of the controllers 41 is connected to the corresponding transmission line 34*a*, and one end of each transmission line 34*a* is connected to the first driving structure 1.

The transmission lines 34 can also comprise a plurality of second-type transmission lines, that is, a plurality of transmission lines 34*b*. Each column of the controllers 41 can be arranged corresponding to one transmission line 34*b*, and each controller 41 in each column of the controllers 41 is connected to the corresponding transmission line 34*b*, and one end of each transmission line 34*b* is connected to the first driving structure 1.

When the plurality of transmission lines 34 comprise the plurality of transmission lines 34*a*, the transmission line 34*a* arranged corresponding to each column of the controllers 41 can be disposed at one side of the column of the controllers 41 and arranged away from the corresponding signal line 31. To be specific, each column of the controllers 41 can be connected to one transmission line 34*a*, as shown in FIG. 2 and FIG. 3. Alternatively, one transmission line 34*a* can be correspondingly disposed between each two columns of the controllers 41, that is, two columns of the controllers 41 share one transmission line 34*a*, as shown in FIG. 5. The transmission line 34*a* arranged corresponding to each column of the controllers 41 can also be located directly under the column of the controllers 41, as shown in FIGS. 4 and 6 to 8.

When the plurality of transmission lines 34 further comprises the plurality of transmission lines 34*b*, the transmission line 34*b* arranged corresponding to each column of the controllers 41 can be disposed directly under the column of the controllers 41. Alternatively, when the transmission line 34*a* arranged corresponding to each column of the controllers 41 is located directly below the column of the controllers 41, the transmission line 34*a* arranged corresponding to each column of the controllers 41 can also be located at one side of the column of the controllers 41 away from the corresponding signal line 31.

The transmission line 34*a* can be a GND line, and the transmission line 34*b* can be a voltage line for providing an operating voltage to the controller; or the transmission line 34*a* can be a voltage line, and the transmission line 34*b* can be a GND line.

In the present embodiment, the signal lines 31, the first signal connection lines 32, the second signal connection lines 33, and the transmission lines 34 can all be arranged in the same metal layer 3. The different lines are arranged in parallel and spaced apart to avoid network structure wiring, thereby simplifying the wiring design, improving the product yield, and reduces the cost.

A voltage delivered in the signal line 31 is relatively high, and therefore, in order to avoid a transmission loss, the signal lines 31 are electrically connected through a first conductive structure to ensure in-plane voltage balance. The signal lines 31 that are electrically connected can be arranged according to actual needs. It is not necessary to electrically connect all the signal lines 31, that is, a portion of the signal lines 31 are electrically connected through the first conductive structure, and a portion of the signal lines 31 are not electrically connected through the first conductive structure.

In a first embodiment, the metal layer 3 further comprises a first wiring connection line 51 extending along the second direction B, the first conductive structure is the first wiring connection line 51, and the first wiring connection line 51 is located at one end of each of the signal lines 31 and is connected to the signal lines 31.

Figure 14:
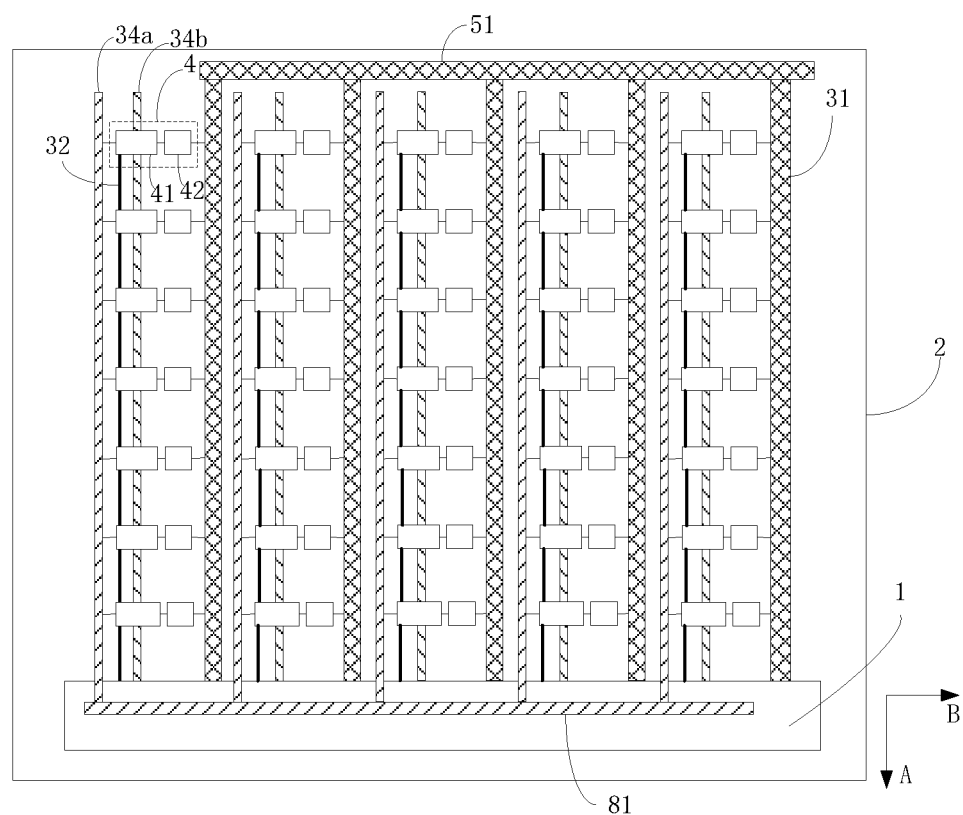
FIG. 14 is a schematic structural view of the backlight module according to one embodiment of the present application.

As shown in FIG. 14, the first wiring connection line 51 can be disposed at one end of each of the signal line 31 that is not connected to the first driving structure 1, that is, the first wiring connection line 51 is located at one end of each of the signal line 31 away from the first driving structure 1. The signal lines 31 extend along the first direction A to the first wiring connection line 51, and are connected to the first wiring connection line 51. The first driving structure 1 can be disposed on the front side of the substrate 2 or on the back side of the substrate 2.

Figure 15:
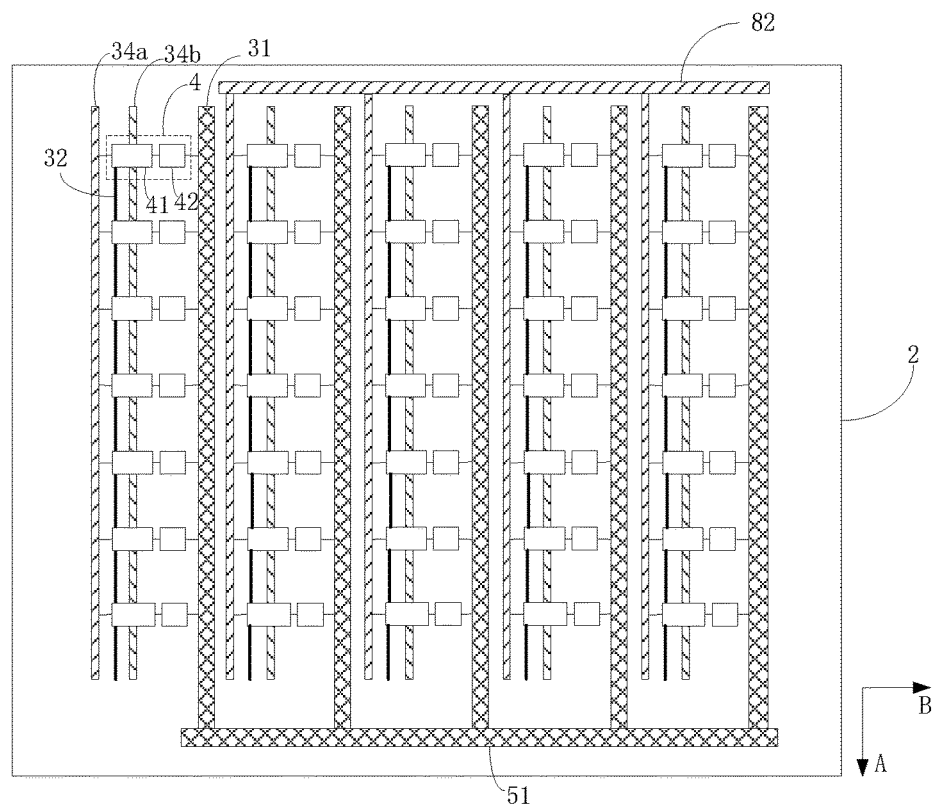
FIG. 15 is a schematic structural view of the backlight module according to one embodiment of the present application.

As shown in FIG. 15, the first wiring connection line 51 can also be disposed at one end of each of the signal lines 31, which is connected to the first driving structure 1, that is, the first wiring connection line 51 is disposed at one end of each of the signal lines 31 close to the first driving structure 1. The signal lines 31 extend along the first direction A to the first wiring connection line 51, and are connected to the first wiring connection line 51. Other lines, such as the first signal connection lines 32, the transmission line 34, also need to be connected to the first driving structure 1, and therefore, in order to avoid other lines being connected to the first wiring connection line 51, the first driving structure 1 can be set on the front side of the substrate 2, and the first wiring connection line 51 is arranged between the first driving structure 1 and the substrate 2 (that is, the first wiring connection line 51 can be arranged directly under the first driving structure 1; however, the first driving structure 1 is not shown in FIG. 15.). Alternatively, the first wiring connection line 51 can be arranged at one side of the first driving structure 1 away from other lines, so that other lines do not need to extend to the first wiring connection line 51 to be connected to the first driving structure 1, thus preventing other lines from contacting with the first wiring connection line 51.

In a second embodiment, the first conductive structure is a second wiring connection line 52 disposed at a bottom of the substrate 2. The signal lines 31 extend along one side surface of the substrate 2 to the back side of the substrate 2 and are connected to the second wiring connection line 52. Alternatively, the signal lines 31 penetrate through the substrate 2 and are connected to the second wiring connection line 52.

Figure 16:
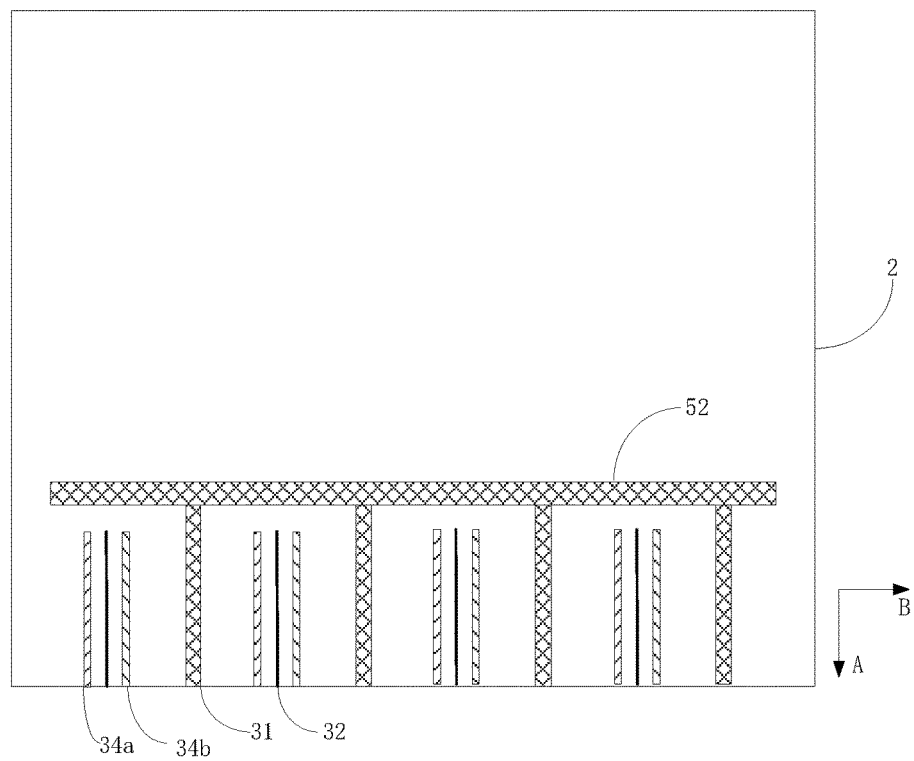
FIG. 16 is a schematic structural view of the backlight module according to one embodiment of the present application.

When the second wiring connection line 52 is disposed on the back side of the substrate 2, the first driving structure 1 can be disposed on the front side of the substrate 2 or on the back side of the substrate 2. When the first driving structure 1 is located on the back side of the substrate 2, as shown in FIG. 16, other lines, such as the first signal connection lines 32 and the transmission lines 34, extend along the side surface of the substrate 2 to the back side of the substrate 2 to be connected to the first driving structure 1. In order to prevent other lines from crossing the second wiring connection line 52, the second wiring connection line 52 can be arranged between the first driving structure 1 and the substrate 2 (that is, the second wiring connection line 52 can be arranged directly under the first driving structure 1; however, the first driving structure is not illustrated in the FIG. 16). Alternatively, the second wiring connection line 52 can be arranged at one side of the first driving structure 1 away from other lines, so that other lines do not need to extend to the second wiring connection line 52 to be connected to the first driving structure 1, and thereby other lines are prevented from contacting with the first wiring connection line 51.

Figure 17:
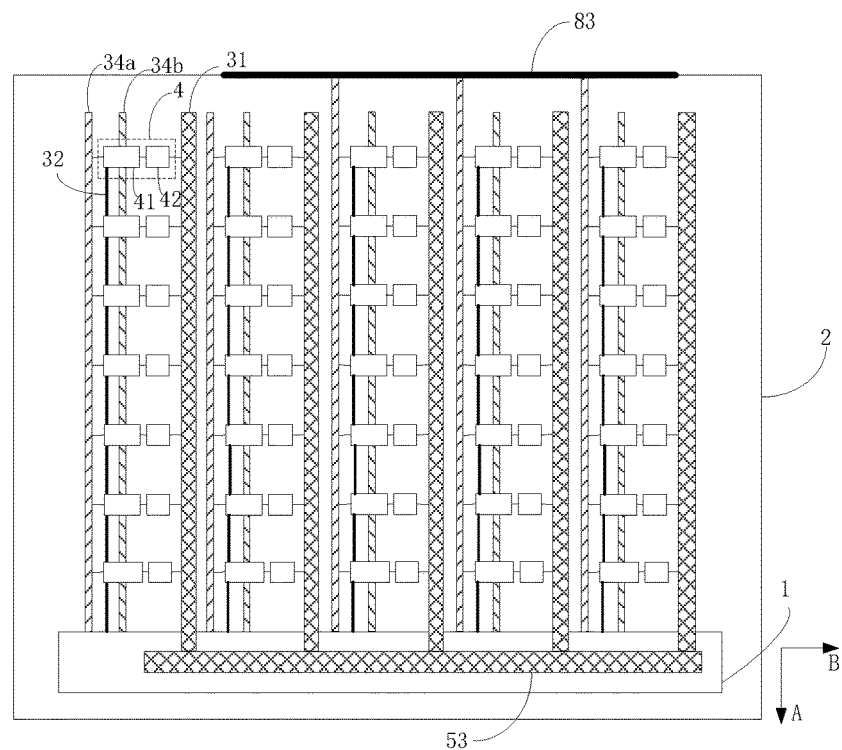
FIG. 17 is a schematic structural view of the backlight module according to one embodiment of the present application.

In a third embodiment, as shown in FIG. 17, the first conductive structure is a third wiring connection line 53 disposed on the first driving structure 1, and the signal lines 31 extend to the first driving structure 1 and are connected to the third wiring connection line 53.

Figure 18:
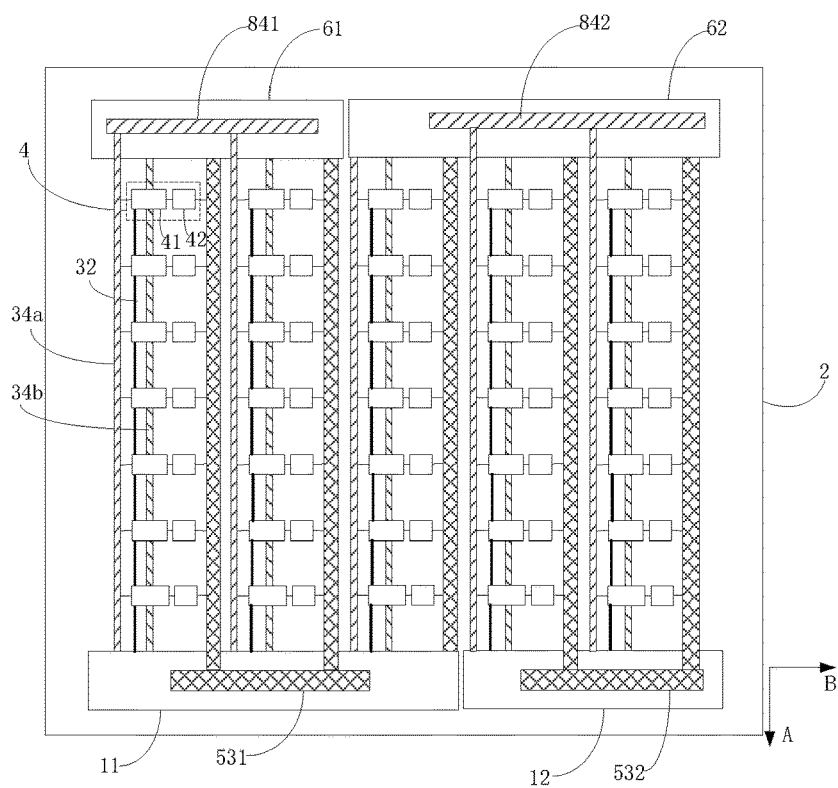
FIG. 18 is a schematic structural view of the backlight module according to one embodiment of the present application.

As shown in FIG. 18, the first driving structure 1 can comprise a first driving circuit board 11 and a second driving circuit board 12, and the third wiring connection line 53 can comprise a first connection sub-line 531 disposed on the first driving circuit board 11 and a second connection sub-line 532 disposed on the second driving circuit board 12. The signal lines 31 can comprise a plurality of first signal lines and a plurality of second signal lines. The first signal lines extend to the first driving circuit board 11 and are connected to the first connection sub-line 531. The second signal lines extend to the second driving circuit board 12 and are connected to the second connection sub-line 532. The number of the first signal lines connected to the first connection sub-line 531 can be equal to or different from the number of the second signal lines connected to the second connection sub-line 532.

Figure 19:
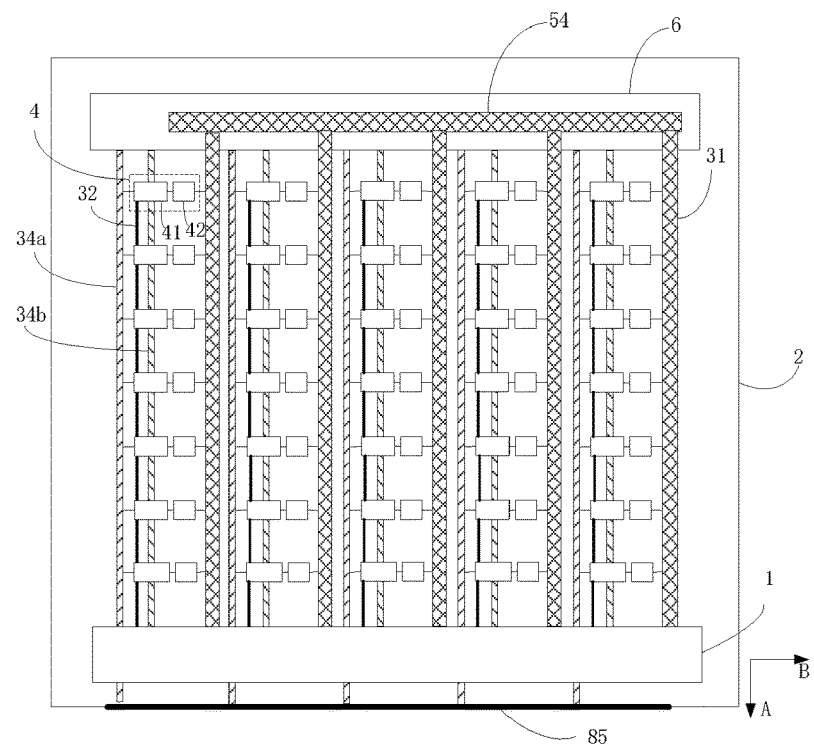
FIG. 19 is a schematic structural view of the backlight module according to one embodiment of the present application.

In a fourth embodiment, as shown in FIG. 19, the backlight module can further comprise a second driving structure 6, and the second driving structure 6 can be disposed at one end of each of the signal lines 31. For example, the second driving structure 6 can be disposed at one end of the signal lines 31 and away from the first driving structure 1, and the first conductive structure is a fourth wiring connection line 54 disposed on the second driving structure 6. The signal lines 31 extend to the second driving structure 6 and are connected to the fourth wiring connection line 54.

Figure 20:
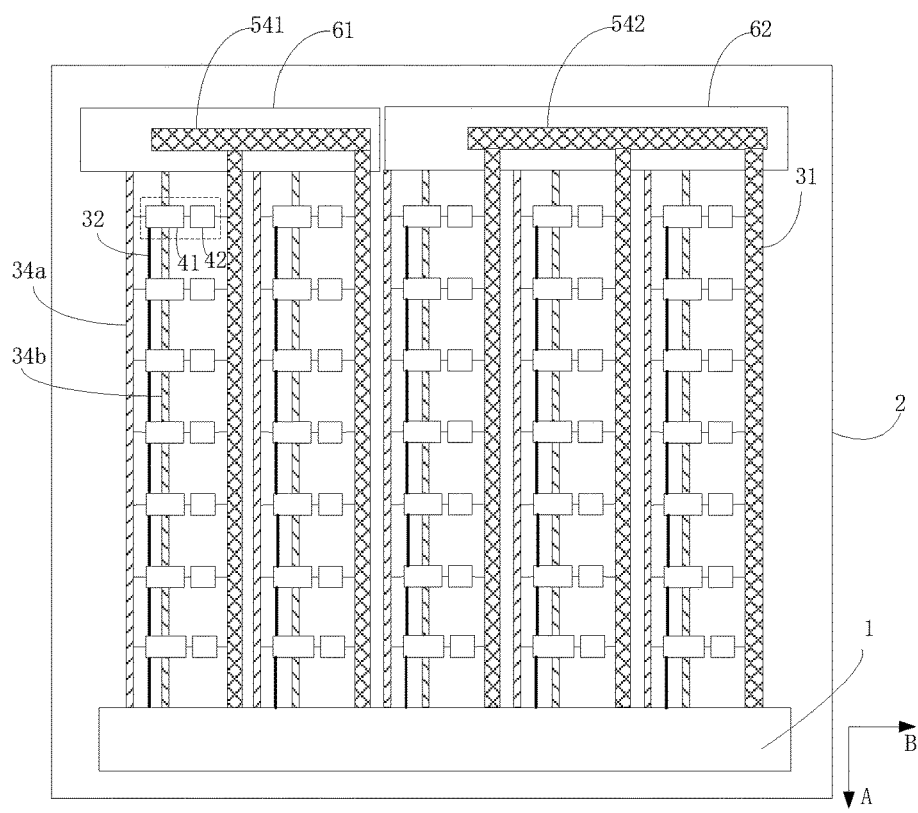
FIG. 20 is a schematic structural view of the backlight module according to one embodiment of the present application.

As shown in FIG. 20, the second driving structure 6 can comprise a third driving circuit board 61 and a fourth driving circuit board 62, and the fourth wiring connection line 54 can comprise a third connection sub-line 541 disposed on the third driving circuit board 61 and a fourth connection sub-line 542 disposed on the fourth driving circuit board 62. The signal lines 31 can comprise a plurality of third signal lines and a plurality of fourth signal lines, and the third signal lines extend to the third driving circuit board 61 and are connected to the third connection sub-line 541. The fourth signal lines extend to the fourth driving circuit board 62 and are connected to the fourth connection sub-line 542. Wherein, the number of the third signal lines connected to the third connection sub-line 541 can be equal to or different from the number of the fourth signal lines connected to the fourth connection sub-line 542.

In a fifth embodiment, the first conductive structure is the first conductive layer 55 disposed on the side surface of the substrate 2. The signal lines 31 extend to the side surface of the substrate 2 and are connected to the first conductive layer 55. The first conductive layer 55 can be formed on the side surface of the substrate 2 by side deposition or metal casting. The first conductive layer 55 can be a silver adhesive, a conductive adhesive, or etc.

Figure 21:
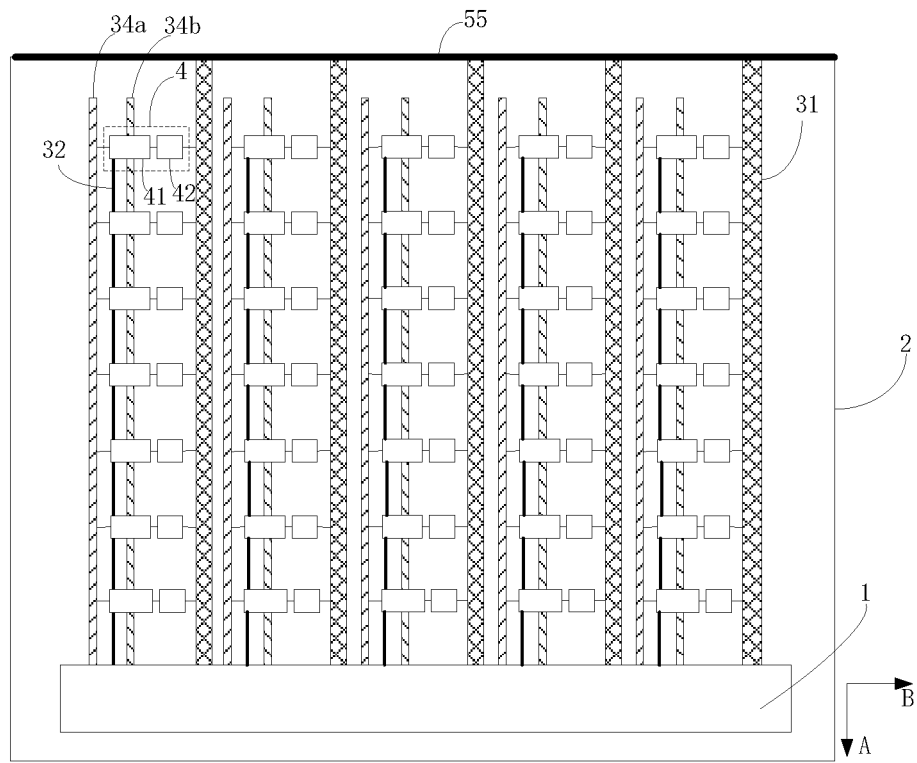
FIG. 21 is a schematic structural view illustrating the backlight module according to one embodiment of the present application.

As shown in FIG. 21, the side surface of the substrate 2 can be a side surface close to one end of the signal lines 31 that is not connected to the first driving structure 1. The signal lines 31 extend to the side surface along the first direction A, and are connected to the first conductive layer 55 on the side surface. The first driving structure 1 can be disposed on the front side of the substrate 2 or on the back side of the substrate 2.

Figure 22:
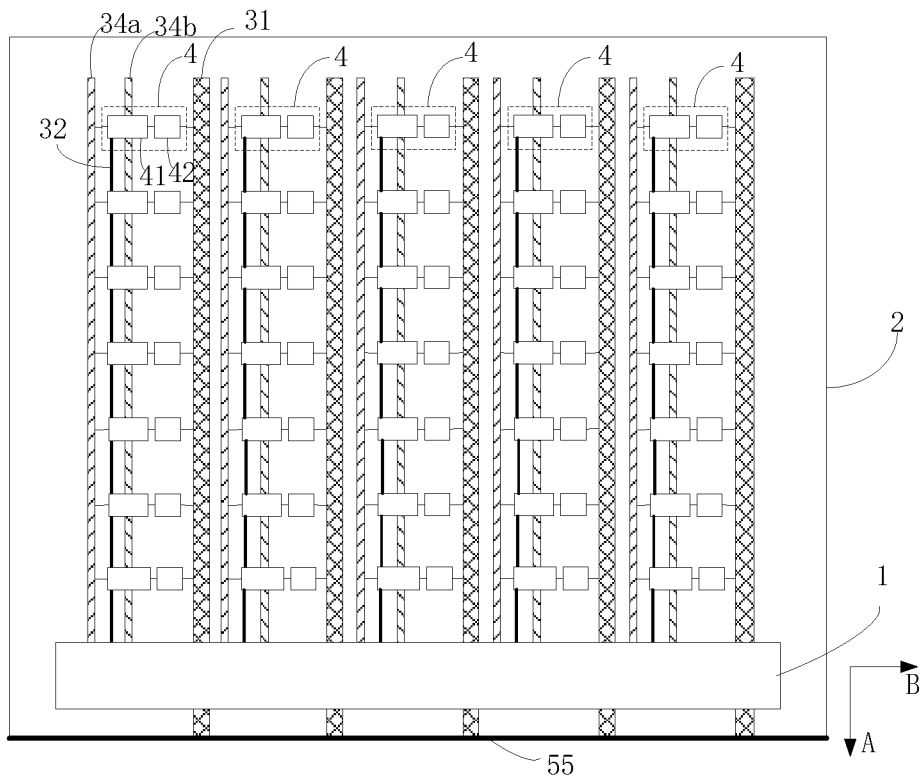
FIG. 22 is a schematic structural view of the backlight module according to one embodiment of the present application.

As shown in FIG. 22, the side surface of the substrate 2 can also be a side surface close to one end of the signal lines 31 connected to the first driving structure 1. Other lines, such as the first signal connection lines 32 and the transmission lines 34, also need to be connected to the first driving structure 1, and therefore, in order to prevent other lines from being connected to the first conductive layer 55 on the side surface, the first driving structure 1 can be arranged on the front side of the substrate 2, so that other lines can be connected to the first driving structure 1 without extending to the side surface, and other lines are prevented from contacting the first conductive layer 55 on the side surface. Each signal line 31 extends to the first driving structure 1, is connected to the first driving structure 1, and continues to extend from below the first driving structure 1 to the side surface, and is connected to the first conductive layer 55 on the side surface.

Figure 23:
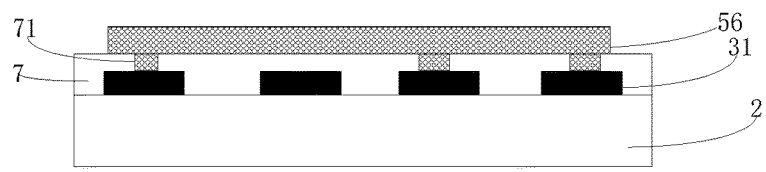
FIG. 23 is a schematic cross-sectional view of the backlight module according to one embodiment of the present application.

In a sixth embodiment, as shown in FIG. 23, the backlight module further comprises a dielectric layer 7 disposed on the substrate 2 and the metal layer 3, and the first conductive structure is a second conductive layer 56 disposed on the dielectric layer 7. The second conductive layer 56 can penetrate through the dielectric layer 7 to be connected to the signal lines 31. To be specific, the dielectric layer 7 is provided with a plurality of first through holes 71, and the second conductive layer 56 is further extended and arranged in the first through holes 71 to be connected to the signal lines 31.

An orthographic projection of the second conductive layer 56 projected on the metal layer 3 overlaps at least a portion of the signal lines 31, and the first through holes 71 are correspondingly arranged at positions where the second conductive layer 56 overlaps the signal lines, so as to ensure that the second conductive layer 56 is connected to the signal lines 31.

The dielectric layer 7 can be black oil, white oil, a reflective sheet, an insulating layer, or etc. During production, the first through holes 71 are formed in the dielectric layer 7 through exposure and other processes. Then, in a later stage of a die bonding process, a conductive material is filled in the first through holes 71 and covers the dielectric layer 7 to form the second conductive layer 56. The conductive material can be solder.

Figure 24:
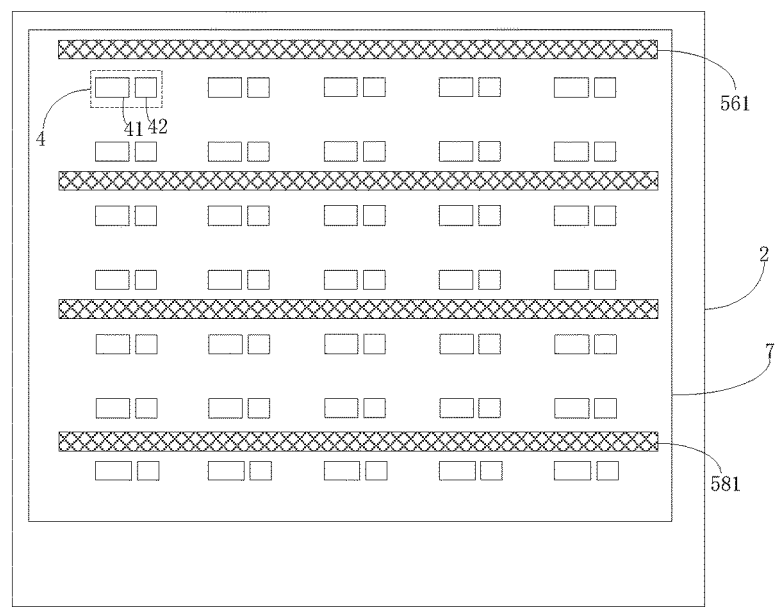
FIG. 24 is a schematic structural view illustrating the backlight module according to one embodiment of the present application.

As shown in FIG. 24, the second conductive layer 56 can comprise a plurality of conductive lines 561, and the conductive lines 561 can penetrate through the dielectric layer 7 to be connected to the signal lines 31. An orthographic projection of each conductive line 561 projected on the metal layer 3 at least partially overlaps the signal lines 31, and the first through holes 71 are correspondingly arranged at positions where the conductive lines 561 overlap the signal lines 31, so as to ensure that the conductive lines 561 are connected to the signal lines 31. Different conductive lines 561 can be connected to the same or partially the same or completely different signal lines 31. By connecting the conductive lines 561 to the signal lines 31 at different positions, uniformity of the in-plane voltage is further improved.

Figure 25:
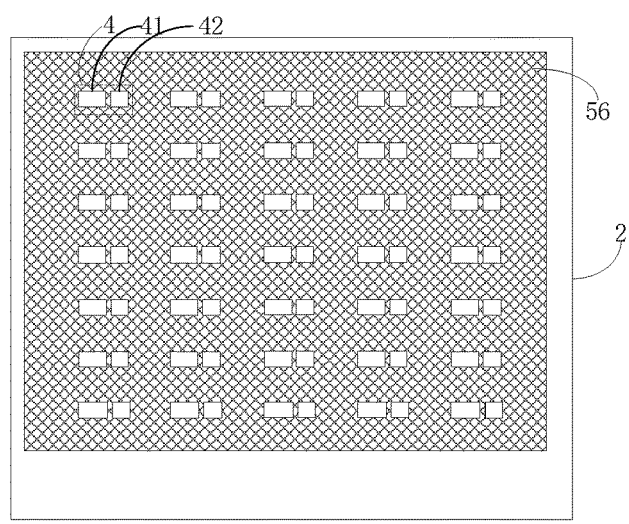
FIG. 25 is a schematic structural view illustrating the backlight module according to one embodiment of the present application.

When the dielectric layer 7 is an insulating layer, the second conductive layer 56 can completely cover the insulating layer, as shown in FIG. 25. Coating an entire surface of the insulating layer with the second conductive layer 56 can not only improve the in-plane uniformity, but also shield signals and improve electromagnetic interference.

Figure 26:
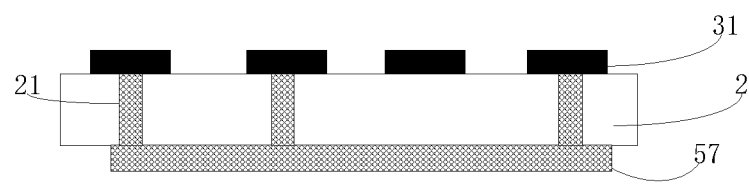
FIG. 26 is a schematic cross-sectional view of the backlight module according to one embodiment of the present application.

In a seventh embodiment, as shown in FIG. 26, the first conductive structure is a third conductive layer 57 disposed on the back side of the substrate 2. The third conductive layer 57 can penetrate through the substrate 2 to be connected to the signal lines 31. To be specific, a plurality of second through holes 21 are defined in the substrate 2, and the third conductive layer 57 is further extended and disposed in the second through holes 21 to be connected to the signal lines 31.

An orthographic projection of the third conductive layer 57 projected on the metal layer 3 at least partially overlaps the signal lines 31, and the second through holes 21 are correspondingly arranged at positions where the third conductive layer 57 and the signal lines 31 overlap, so as to ensure that the third conductive layer 57 is connected to the signal lines 31.

Figure 27:
FIG. 27 is a schematic structural view illustrating the backlight module according to one embodiment of the present application.

As shown in FIG. 27, the third conductive layer 57 can comprise a plurality of conductive lines 571. The conductive lines can penetrate through the substrate 2 to be connected to the signal lines 31. In detail, an orthographic projection of each conductive line 571 projected on the metal layer 3 at least partially overlaps the signal lines 31, and the second through holes 21 are correspondingly arranged at positions where the conductive lines 571 and the signal lines 31 overlap, so as to ensure that the conductive lines 571 are extended in the second through holes 21 to be connected to the signal lines 31. Different conductive lines 571 can be connected to completely the same, partially the same, or completely different signal lines 31. By connecting the conductive lines 571 to the signal lines 31 at different positions, the uniformity of the in-plane voltage can be further improved.

The transmission lines 34 also need to deliver voltage, and therefore, in order to avoid a transmission loss, the backlight module can further comprise a second conductive structure, and the same type of transmission lines in the transmission lines 34 can also be electrically connected through the second conductive structure to further ensure the balance of the in-plane voltage. The transmission lines 34 of the same type that are electrically connected can be arranged according to actual needs. It is not necessary to electrically connect all the transmission lines 34 of the same type. That is to say, a portion of the transmission lines 34 of the same type can be electrically connected through the second conductive structure, while some of the transmission lines of the same type are not electrically connected through the second conductive structure.

The way that the transmission lines of the same type are connected through the second conductive structure is similar to the way that the signal lines 31 are connected through the first conductive structure. That is to say, the transmission lines of the same type can be connected through the above-mentioned seven embodiments. The seven embodiments of the signal lines 31 can collaborate freely with the seven embodiments of the transmission lines of the same type, as long as the connection between the signal lines 31 and the connection between the transmission lines of the same type do not cross.

For example, the transmission lines of the first type, that is, the transmission lines 34a, are electrically connected through the second conductive structure. As shown in FIG. 14, the first conductive structure is the first wiring connection line 51 disposed at one end of the signal lines 31 away from the first driving structure 1, the second conductive structure can be a wiring connection line 81 disposed on the first driving structure 1, and the transmission lines 34a extend to the first driving structure 1 and are connected to the wiring connection line 81.

As shown in FIG. 15, the first conductive structure is the first wiring connection line 51 disposed at one end of the signal lines 31 close to the first driving structure 1, and the second conductive structure can be a wiring connection line 82 disposed at one end of the signal lines 31 away from the first driving structure. The transmission lines 34a extend to the wiring connection line 82 and are connected to the wiring connection line 82.

As shown in FIG. 17, the first conductive structure is a third wiring connection line 53 disposed on the first driving structure 1, and the second conductive structure can be a conductive layer 83 arranged on the side surface of the substrate 2 away from the first driving structure 1. The transmission lines 34a extend to the side surface and are connected to the conductive layer 83 disposed on the side surface.

As shown in FIG. 18, the first conductive structure comprises the first connection sub-line 531 disposed on the first driving circuit board 11 and the second connection sub-line 532 disposed on the second driving circuit board 12. The second conductive structure can comprise a third connection sub-line 841 disposed on the third driving circuit board 61 and a fourth connection sub-line 842 disposed on the fourth driving circuit board 62. A portion of the transmission lines 34a extends to the third driving circuit board 61 and is connected to the third connection sub-line 841, and a portion of the transmission wiring 34a extend to the fourth driving circuit board 62 and are connected to the fourth connection sub-line 842.

As shown in FIG. 19, the first conductive structure is the fourth wiring connection line 54 disposed on the second driving structure 6, and the second conductive structure is a conductive layer 85 arranged on the side surface of the substrate 2 close to the first driving structure 1. The transmission lines 34a extend to the first driving structure 1, are connected to the first driving structure 1, and continue to extend from under the first driving structure 1 to the side surface of the substrate 2 to be connected to the conductive layer 85 on the side surface.

In addition, the second conductive structure can also be a wiring connection line disposed on the back side of the substrate 2, or can be a conductive layer disposed on the dielectric layer 7, or can be a conductive layer disposed on the back side of the substrate 2; a detailed description thereof is omitted herein for brevity.

In summary, in the present application, a metal layer 3 is disposed on a substrate. The metal layer 3 comprises a plurality of signal lines 31 and a plurality of first signal connection lines 32 extending along a first direction A. The signal lines 31 and the first signal connection lines 32 are arranged in the same layer. One signal line 31 is disposed at each of at least one side of each column of light-emitting control structures 4. Each light-emitting control structure 4 in each column of the light-emitting control structures 4 is connected to the corresponding signal line 31, and any two adjacent light-emitting control structures 4 in each column of the light-emitting control structures 4 are connected by one first signal connection line 32 to simplify a wiring design and ensure that the lines are located in the same metal layer, which improves the product yield and reduces the cost. The signal lines 31 are connected through the first conductive structure, and the transmission lines 34 are connected through the second conductive structure, so the uniformity of the in-plane voltage is effectively improved.

Figure 28:
FIG. 28 is a schematic structural view illustrating a display device according to one embodiment of the present application.
Figure 29:
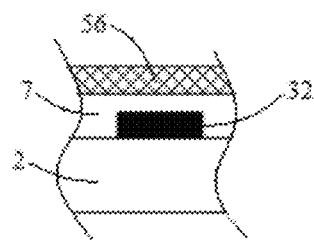
FIG. 29 is a schematic partial cross-sectional view of the backlight module according to one embodiment of the present application.

As shown in FIG. 28, one embodiment of the present application provides a display device. The display device comprises a display panel 100 and a backlight module 200. The display panel 100 is disposed on the backlight module 200, and the backlight module 200 is the backlight module in the above embodiments, so a detailed description thereof is not repeated herein for brevity.

The display device provided by the present application can simplify the wiring design in the backlight module 200, can ensure that the lines are located in the same metal layer, and can improve product yield and reduce costs. The signal lines in the backlight module 200 are connected through the first conductive structure, and the transmission lines of the same type are connected through the second conductive structure, thus effectively improving the uniformity of the in-plane voltage.

In summary, although the application has been disclosed as above in preferable embodiments, the above-mentioned embodiments are not intended to limit the present application. Those of ordinary skill in the art can make various changes and modifications without departing from the spirit and scope of the present application, so the protection scope of the present application should be defined by the appended claims.

What is claimed is:

1. A backlight module, comprising:
a substrate;
a metal layer disposed on the substrate, the metal layer comprising a plurality of signal lines and a plurality of first signal connection lines extending along a first direction, wherein the signal lines and the first signal connection lines are horizontally aligned with each other on a same plane on a front side of the substrate and on a same plane on a back side of the substrate; and
a plurality of light-emitting control structures disposed on the metal layer and arranged in a plurality of columns, wherein one of the signal lines is disposed on at least one side of each column of the light-emitting control structures, the light-emitting control structures in each column are connected to a corresponding one of the signal lines, and any two adjacent ones of the light-emitting control structures in each column of the light-emitting control structures are connected through one of the first signal connection lines,
wherein each of the light-emitting control structures comprises a controller and at least one light-emitting unit, each of the controllers in each column of the light-emitting control structures and the corresponding signal line are electrically connected to the corresponding at least one light-emitting unit, all the controllers in each column of the light-emitting control structures are directly electrically connected to each other through a same-layer electrical connection path established by one of the first signal connection lines across each column of the light-emitting control structures, and the controllers are arranged on a same side in each column of the light-emitting control structures,
wherein an orthographic projection of the signal lines does not overlap with an orthographic projection of the light-emitting control structures on the substrate.

2. The backlight module according to claim 1, wherein one of the signal lines is arranged on one side of each column of the light-emitting control structures; or
two of the signal lines are disposed on two sides of each column of the light-emitting control structure; or
one of the signal lines is arranged between each two columns of the light-emitting control structures; or
one of the signal lines is arranged between any two adjacent columns of the light-emitting control structures.

3. The backlight module according to claim 2, wherein the metal layer further comprises a plurality of second signal connection lines extending along the first direction, and the second signal connection lines are arranged in the same layer as the signal lines and the first signal connection lines; and
each of the controllers and the corresponding at least one light-emitting unit are electrically connected to a corresponding one of the second signal connection lines.

4. The backlight module according to claim 3, wherein the controller and the at least one light-emitting unit are arranged along a second direction, the second signal connection line is arranged between the controller and the at least one light-emitting unit, and the at least one light-emitting unit is arranged between the controller and the corresponding signal line; or
the controller and the at least one light-emitting unit are arranged along the first direction, and the corresponding second signal connection line is arranged at one side of the at least one light-emitting unit away from the corresponding signal line.

5. The backlight module according to claim 4, wherein each of the light-emitting units comprises a plurality of LED lamps arranged in at least one row along the second direction; and
the LED lamps of each row in the light-emitting unit are connected in series, and one end of each row of the LED lamps connected in series is electrically connected to the corresponding second signal connection line, and the other end of each row of the LED lamps is electrically connected to the corresponding signal line.

6. The backlight module according to claim 3, wherein the metal layer further comprises a plurality of transmission lines extending along the first direction, the controllers in each column of the light-emitting control structures constitute a column of the controllers, and each of the controllers in each column of the controllers is connected to a corresponding one of the transmission lines; and
one of the transmission lines is disposed at one side of each column of the controllers and arranged away from the corresponding signal line, and/or at least one of the transmission lines are arranged between each column of the controllers and the substrate.

7. The backlight module according to claim 1, wherein the backlight module further comprises a first conductive structure, and the signal lines are electrically connected through the first conductive structure.

8. The backlight module according to claim 7, wherein the metal layer further comprises a first wiring connection line extending in a second direction, and the first conductive structure is the first wiring connection line; and
the first wiring connection line is arranged at one end of each of the signal lines and is connected to the signal lines.

9. The backlight module according to claim 7, wherein the first conductive structure is a second wiring connection line disposed on a back surface of the substrate;
the signal lines extend along a side surface of the substrate to the back surface of the substrate and are connected to the second wiring connection line; or
the signal lines pass through the substrate and are connected to the second wiring connection line.

10. The backlight module according to claim 8, wherein the backlight module further comprises a first driving structure, and the first driving structure is connected with one longitudinal end of each of the signal lines and one longitudinal end of each column of the light-emitting control structures; and when the first conductive structure and the first driving structure are disposed on a same side of the substrate and at a same end of the signal lines, the first conductive structure is located between the first driving structure and the substrate, or the first conductive structure is located at one side of the first driving structure away from the signal lines.

11. The backlight module according to claim 7, wherein the backlight module further comprises a first driving structure, the first driving structure is connected with one end of each of the signal lines and one end of each column of the light-emitting control structures, and the first conductive structure is a third wiring connection line disposed on the first driving structure; and the signal lines extend to the first driving structure and are connected with the third wiring connection line.

12. The backlight module according to claim 11, wherein the first driving structure comprises a first driving circuit board and a second driving circuit board, and the third wiring connection line comprises a first connection sub-line disposed on the first driving circuit board and a second connection sub-line disposed on the second driving circuit board; and the signal lines comprise a plurality of first signal lines and a plurality of second signal lines, the first signal lines extend to the first driving circuit board and are connected to the first connection sub-line, and the second signal lines extend to the second driving circuit board and are connected with the second connection sub-line.

13. The backlight module according to claim 7, wherein the backlight module further comprises a second driving structure, the second driving structure is disposed at one end of each of the signal lines, and the first conductive structure is a fourth wiring connection line disposed on the second driving structure; and the signal lines extend to the second driving structure and are connected with the fourth wiring connection line.

14. The backlight module according to claim 13, wherein the second driving structure comprises a third driving circuit board and a fourth driving circuit board, the fourth wiring connection line comprises a third connection sub-line disposed on the third driving circuit board and a fourth connection sub-line disposed on the fourth driving circuit board;

the signal lines comprise a plurality of third signal lines and a plurality of fourth signal lines, the third signal lines extend to the third driving circuit board and are connected with the third signal lines, and the fourth signal lines extend to the fourth driving circuit board and are connected with the fourth connection sub-line.

15. The backlight module according to claim 7, wherein the first conductive structure is a first conductive layer disposed on a side surface of the substrate; the signal lines extend to the side surface of the substrate and are connected to the first conductive layer; or the first conductive structure is a third conductive layer disposed on a back surface of the substrate; the third conductive layer passes through the substrate to be connected to the signal lines.

16. The backlight module according to claim 7, wherein the backlight module further comprises a dielectric layer disposed on the substrate and the metal layer, and the first conductive structure is a second conductive layer disposed on the dielectric layer; and the second conductive layer passes through the dielectric layer to be connected to the signal lines.

17. The backlight module according to claim 16, wherein the second conductive layer comprises a plurality of conductive lines; and each of the conductive lines penetrates the dielectric layer to be connected to the signal lines.

18. The backlight module according to claim 16, wherein the dielectric layer is an insulating layer, and the second conductive layer completely covers the insulating layer.

19. The backlight module according to claim 6, wherein the transmission lines comprise at least one type of the transmission lines, and each column of the controllers is correspondingly connected to a same type of the transmission lines; and the backlight module further comprises a second conductive structure, and the transmission lines of the same type are electrically connected through the second conductive structure.

20. A display device, comprising a display panel and the backlight module, the backlight module comprising:

a substrate;

a metal layer disposed on the substrate, the metal layer comprising a plurality of signal lines and a plurality of first signal connection lines extending along a first direction, wherein the signal lines and the first signal connection lines are horizontally aligned with each other on a same plane on a front side of the substrate and on a same plane on a back side of the substrate; and a plurality of light-emitting control structures disposed on the metal layer and arranged in a plurality of columns, wherein one of the signal lines is disposed on at least one side of each column of the light-emitting control structures, each of the light-emitting control structures in each column are connected to a corresponding one of the signal lines, and any two adjacent ones of the light-emitting control structures in each column of the light-emitting control structures are connected through one of the first signal connection lines, wherein each of the light-emitting control structures comprises a controller and at least one light-emitting unit, each of the controllers in each column of the light-emitting control structures and the corresponding signal line are electrically connected to the corresponding at least one light-emitting unit, all the controllers in each column of the light-emitting control structures are directly electrically connected to each other through a same-layer electrical connection path established by one of the first signal connection lines across each column of the light-emitting control structures, and the controllers are arranged on a same side in each column of the light-emitting control structures, wherein the display panel is disposed on the backlight module, wherein an orthographic projection of the signal lines does not overlap with an orthographic projection of the light-emitting control structures on the substrate.

\* \* \* \* \*